United States Patent
Brey et al.

(10) Patent No.: US 8,436,775 B2
(45) Date of Patent: May 7, 2013

(54) FAKRA-COMPLIANT ANTENNA

(75) Inventors: Thomas Brey, Lake in the Hills, IL (US); David Teteak, Crystal Lake, IL (US); Bhavna Mantha, Arlington Heights, IL (US); Peter Saladin, Palatine, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 269 days.

(21) Appl. No.: 12/353,548

(22) Filed: Jan. 14, 2009

(65) Prior Publication Data
US 2010/0176995 A1   Jul. 15, 2010

(51) Int. Cl.
*H01Q 1/24* (2006.01)
*H01Q 1/50* (2006.01)

(52) U.S. Cl.
USPC ............................................. 343/702; 343/906

(58) Field of Classification Search .................. 343/702, 343/906; 336/65, 192; 439/916
See application file for complete search history.

(56) References Cited

U.S. PATENT DOCUMENTS

| | | | | |
|---|---|---|---|---|
| 4,725,845 | A * | 2/1988 | Phillips ........................... | 343/702 |
| 5,329,287 | A * | 7/1994 | Strickland ....................... | 343/752 |
| 6,809,692 | B2 * | 10/2004 | Puente Baliarda et al. ... | 343/713 |
| 7,068,227 | B2 * | 6/2006 | Ying ............................... | 343/702 |
| 7,202,836 | B2 * | 4/2007 | Ooi et al. ........................ | 343/895 |

FOREIGN PATENT DOCUMENTS

| | | |
|---|---|---|
| CN | 2760795 | 2/2006 |
| EP | 1076378 | 2/2001 |
| EP | 1324429 | 7/2003 |
| EP | 1453151 | 9/2004 |
| WO | WO 2007082727 A1 * | 7/2007 |

OTHER PUBLICATIONS

International Search Report for PCT/US2010/020860, filed Jan. 13, 2010.
Osram Sylvania: "NuChannel High Frequency FAKRA SMB Headers" Business Products, Mar. 19, 2006 [Online] [retrieved on Jun. 21, 2010] Retrieved from the Internet : <URL:http://www.sylvania.com/BusinessProducts/MaterialsandComponents/AutomotiveComponents/AutomotiveAntennaeCableSystems/NuChannel/NuChannel™+High+Frequency+FAKRA+SMB+Headers.htm>.
Amphenol RF, RF Solutions for the Telematics Market, FAKRA SMB Connectors Version 3.0, Amphenol RF: 800-627-7100 Copyright 2007, Amphenol RF, rev. b, PDF-Datum Jan. 25, 2008, http://www.amphenolrf.com/products/Brochures/FAKRACatalog.pdf, rech. Jan. 11, 2003.

(Continued)

*Primary Examiner* — Jacob Y Choi
*Assistant Examiner* — Graham Smith

(57) ABSTRACT

A circuit-board mountable antenna (50, 80, 90) has a substrate (12,14) compliant with the IPC/JEDEC J-STD_0202C and IEC-norm standard 60068, which specifies the spacing and pin arrangements for a printed circuit board (PCB) mountable connector commonly known in the automotive electronic art as a "FAKRA" or "Fakra." A radio frequency (RF) energy transducer or antenna (54) is applied to or formed over the substrate (12, 14) which is provided with at least one mounting pin (16) and a signal lead (18), the spacing and locations of which are compliant with the Fakra ISO-compliant hole pattern. The antennae (50, 80, 90) thus provide a circuit board (70) mountable antenna, compliant with the Fakra standard. The Fakra-compliant antenna or a Fakra-compliant connector can be attached to the circuit board (70) for a communications device (100) at the time of assembly to enable the communications device to use either a concealed or concealable antenna or an external antenna.

12 Claims, 5 Drawing Sheets

OTHER PUBLICATIONS

TEM Electronic Components, GPS-Antenne, PDF-Datum May 22, 2009, http:tme.eu/de/ document/ 7e83e0313647430f8fcc08e597fe6014/antenygps.pdf, [rech. Jan. 11, 2013].

Bigpatsfan.Com (Steve Aschettino), Installation of Advanced Autovations Bluetooth kit in a pre-2002 BMW e46, http://web.archive.org/web/20051125114300/http://www.bigpatsfans.com/bt/bluetooth.htm, [rech. Jan. 11, 2013].

International Standard, Road Vehicles—50 ohms Impedance radio frequency connection system interface—Part 1: Dimensions and electrical requirements, Norm ISO 20860-1 : 2008, First Edition Oct. 15, 2008, Switzerland.

Neosid Elktronische Bauelemente Electronic Components, Spulen, Bausatze, Kunststoffleile Filters, Coil Assemblies, Thermoplastic Parts 3, http://www.rudius.net/oz2m/700mhz/neosid.pdf, PDF-Datum Aug. 20, 2003, rech. Jan. 11, 2013.

Rutronik Europe, Short and Long Range Solutions Wireless Technologies, RUTRONIK Katalog 2007, http://www.elektronikpraxis.vogel.de/fileserver/vogelonline/files/406.pdf, rech. Jan. 11, 2013.

IMS Connector Systems, SMBA (FAKRA) HF-Koaxialsteckverbinder, http://www.imcs.com/contacts/info_pdf/SMBA_Katalog.pdf, PDF-Datum Feb. 23, 2007, rech. Jan. 11, 2013.

Office Action dated Jan. 14, 2013, from related German patent application No. 11 2010 000 793.4.

\* cited by examiner

FAKRA-COMPLIANT ANTENNA

BACKGROUND

The IPC/JEDEC J-STD_0202C and IEC-norm standard 60068 specify spacing and pin arrangements for a printed circuit board (PCB) mountable connector commonly known in the automotive electronic art as a "FAKRA" or "Fakra." FIG. 1 is a prospective view of a typical prior art Fakra connector 10. The connector 10 is preferably formed by molding a dielectric, such as plastic, ceramic or glass in the shape depicted in FIG. 1.

The connector 10 in FIG. 1 has a first, right circular and cylindrically-shaped portion 2, which extends away from a substantially cubic-shaped circuit board mounting portion 4, at the center of which is a signal-carrying conductor, not shown in FIG. 1. The cylindrical portion is sized, shaped and arranged to be received into a mating female receptacle connector, also not shown. The cylindrical portion 2 has a detent or latch 3, which locks a mating receptacle connector to the connector 10 depicted in FIG. 1. The circuit board mounting portion is provided with four corner-located mounting posts 6, two of which are visible in FIG. 1.

FIG. 2 is a right side elevation view of the connector 10 shown in FIG. 1. The first, cylindrically-shaped portion 2 and the cubic-shaped connector mounting portion 4 are configured so that the connector mounting portion 2 can extend outward and away from the edge of a circuit board, not shown in FIG. 1 or 2. The two, corner-located mounting posts 6 depicted in FIG. 2 extend downwardly and orthogonal to the substantially planar bottom face 5 of the cubic-shaped circuit board mounting portion 4. A signal lead 8 is depicted in FIG. 2 as between the two mounting posts shown in FIG. 2. The signal lead 8 also extends orthogonally down from the circuit board mounting portion 4.

FIG. 3 is a bottom view of the connector shown in FIG. 1 and FIG. 2. FIG. 3 shows the four corner-located mounting posts 6 and the center-located signal lead 8. The geometry of the mounting posts 6 relative to each other and the placement of the signal lead 8 are specified in the aforementioned Fakra standards. Their configuration, i.e., their number and spacing, relative to each other, determines whether the connector 10 is compliant with the aforementioned Fakra standards. They therefore determine whether the connector 10 is, or is not a Fakra connector.

The Fakra connector depicted in FIGS. 1,2 and 3 is well known to those of ordinary skill in the art as an automotive electronics industry-standard connector. It is often used to connect a coaxial cable between a vehicle-mounted wireless communications device like a cellular telephone and global positioning system (GPS) receiver, to an antenna located on or in a vehicle window, or on an exterior vehicle surface.

A problem with mounting antennae on a vehicle surface or in a vehicle window is that such antennae are susceptible to theft and vandalism. Any sort of communications device or GPS receiver will therefore be rendered useless, if the external antenna for the device is either damaged or stolen. Concealing or re-locating the antennae that such devices require where they would not be visible or susceptible to vandalism would prevent or reduce the likelihood that the device would be rendered inoperative. An antenna that is less susceptible, or immune to theft or damage would be an improvement over the prior art, especially when used with vehicles.

DETAILED DESCRIPTION

Figure 1:
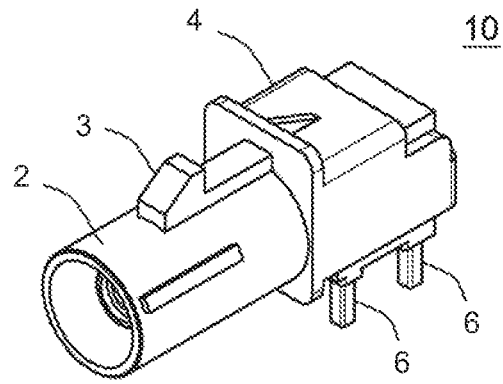
FIG. 1 is a perspective view of a prior art Fakra-compliant connector.
Figure 2:
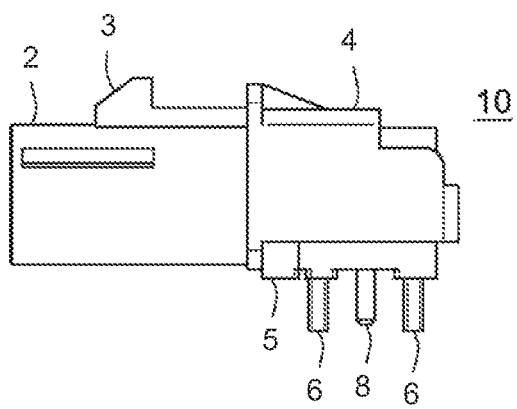
FIG. 2 is a right-side view of the connector shown in FIG. 1.
Figure 3:
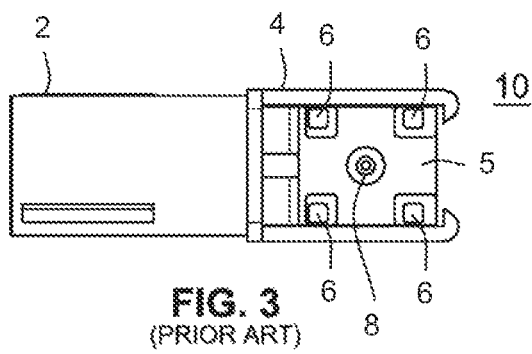
FIG. 3 is a bottom view of the connector shown in FIG. 1.
Figure 4:
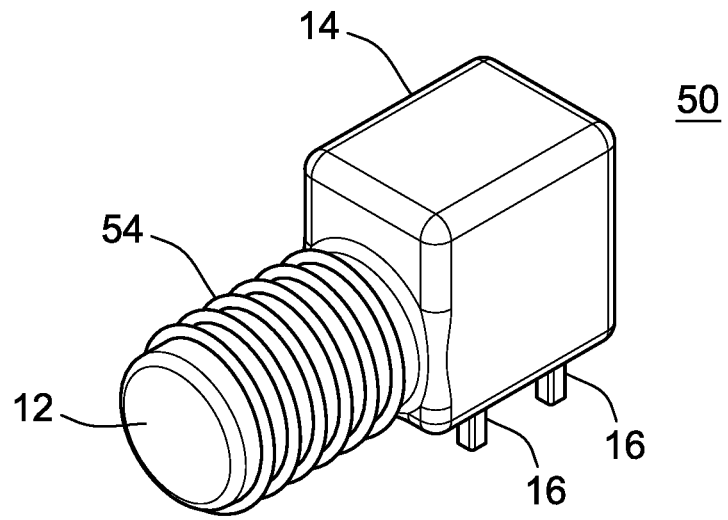
FIG. 4 is a perspective view of one embodiment of a Fakra-compliant antenna.

FIG. 4 shows a perspective view of an embodiment of a Fakra-compliant antenna 50. As with the connector 10 shown in FIGS. 1-3, the antenna 50 depicted in FIG. 4 has a substantially cube-shaped circuit board mounting portion 14 that is provided with one or more locating posts 16 that extend orthogonally from the bottom face 15 of the circuit board mounting portion 1. A signal lead, not shown in FIG. 4, also extends downward from and orthogonal to the bottom face 15 of the circuit board mounting portion 14 similar to the signal lead depicted in FIGS. 2 and 3 above. Unlike the connector 10 depicted in FIGS. 1-3, the detent 13 depicted in FIGS. 1-3 is removed from the cylindrical portion 12.

The circuit board mounting portion 14 and the cylindrical portion 12 are preferably formed as a monolithic block of dielectric material, such as plastic, glass or ceramic. The circuit board mounting portion 14 and the cylindrical portion 12, support an antenna described below, which is comprised of a predetermined length of wire 54, wound around the exterior surface of the cylindrical portion 12 to form an inductor that is resonant in at least one frequency band of operation for a radio communications device, not shown in FIG. 4. Since the circuit board mounting portion 14 and cylindrical portion 12 support the antenna formed from the wire wound around the cylindrical portion 12, they are considered herein to be a support structure or substrate for the radio frequency-transducing antenna 54. The terms, wire, antenna and coil are used interchangeably hereinafter and identified collectively by reference numeral 54.

Except for relatively short portions at opposite ends of the wire 54, the wire wound around the cylindrical portion 12 is coated with an insulative material. In one embodiment, the uncoated portion of one end of the wire coil 54 is electrically connected to the center-located signal lead 18 that extends from the bottom surface of the circuit board mounting portion 14 while the opposite, second end of the wire coil 54 is left open or floating. In another embodiment, the uncoated portion of the second end of the coil is connected to either a conductive material (not shown) on the surface of the substrate (12 and 14) or it is extended to a ground plane that is formed on or attached to, the bottom surface 15 of the circuit board mounting portion 14. Neither end of the coil 54 is visible in FIG. 4.

Figure 5:
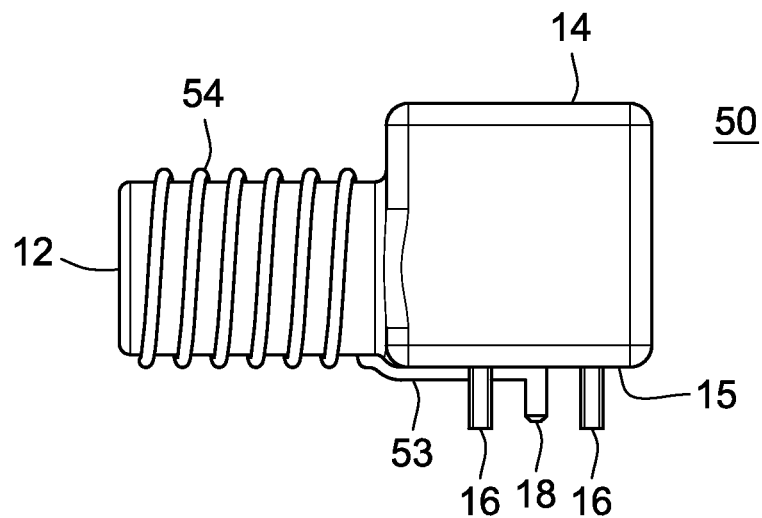
FIG. 5 is a right-side view of the antenna shown in FIG. 4.
Figure 6:
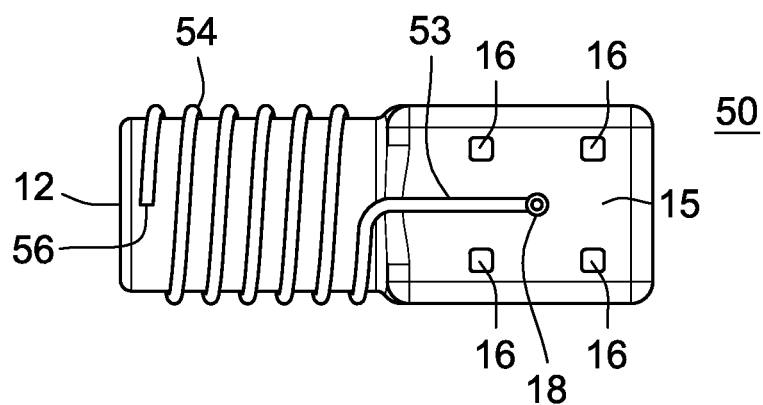
FIG. 6 is a bottom view of the antenna shown in FIG. 4.

FIG. 5 is a side elevation view of the antenna 50 shown in FIG. 4. This view shows that the first end 53 of the coil 54 extends over the bottom surface 15 and is electrically connected to the aforementioned signal lead 18. FIG. 6 is a bottom view of the antenna 50 shown in FIG. 4 and FIG. 5 showing the connection of the first end 53 of the coil 54 is connected to the aforementioned center-located signal lead 18. The second end 56 of the coil/antenna 54 can either be floating, or connected to the aforementioned conductive layer over the material from which the substrate is formed, but which is not shown in the figures.

The wire used to form the coil 54 has a physical length, selected such that when the length of wire is wound around the cylindrical portion 52, the number of turns and the diameter of the winding imbues the coil 54 with electrical characteristics (inductance and capacitance) which make the coil 54 resonant in at least one operating frequency band used by a communications device coupled to the antenna 50.

As can be seen in FIG. 6, the circuit board mounting portion 14 is provided with four alignment pins 16, each of which is located at a corresponding corner of the cube-shaped circuit board mounting portion 14. The signal lead 18 is located at the center of the circuit board mounting portion 14. Alternate embodiments use one, two or three mounting pins 18, at least one of which forms a ground pin connection for the aforementioned ground plane on the bottom surface 15, or for a conductive coating on the exterior surfaces of the substrate (12 and 14).

Figure 7:
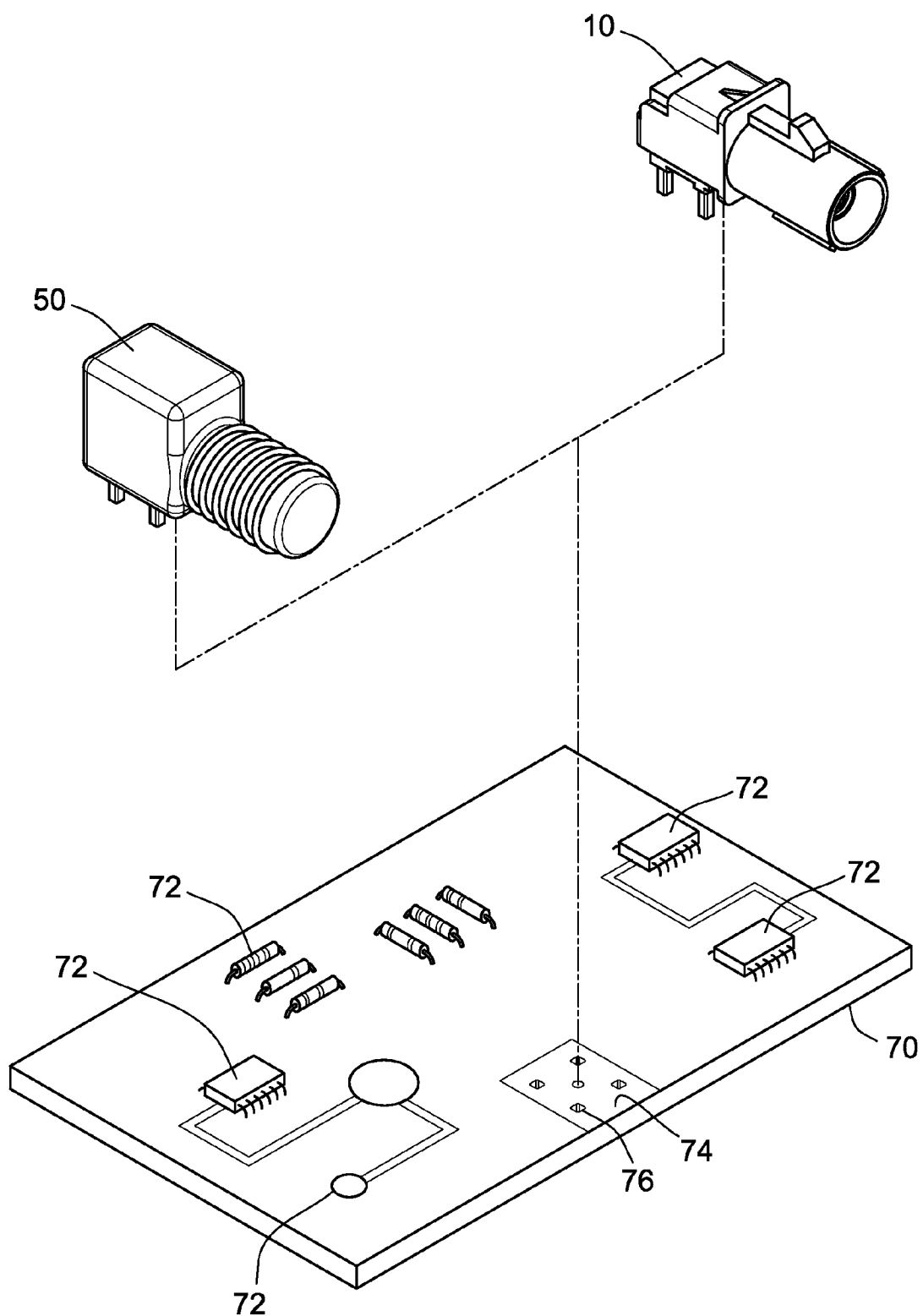
FIG. 7 illustrates the use of a Fakra-compliant connector or the Fakra-compliant antenna with a circuit board of an electronic communications device.

Referring now to FIG. 7, there is shown a circuit board 70 attached to which are several electronic components 72 that comprise or form operational components of a communications device, such as a global positioning system (GPS) receiver, a Bluetooth transceiver and/or a cellular telephone, such as a GSM or CDMA phone. The circuit board 70 has a square-shaped area or land 74, which defines the locations of the aforementioned Fakra ISO-standard mounting hole pattern 76 on the circuit board 70. Since the mounting hole pattern 76 is compliant with the aforementioned Fakra standard, it will of course accept one or more of the alignment pins 16 and the signal lead 18 in the aforementioned Fakra antenna 50. The mounting hole pattern 76 will also accept a Fakra connector, such as the connector 10 depicted in FIGS. 1, 2 and 3. The circuit board 70 thus enables one or more communications devices mounted on the circuit board 70 to receive and/or transmit RF signals through either an external antenna (using the aforementioned connector 10) or a circuit-board mounted Fakra-compliant antenna 50 depicted in FIGS. 4-6. As FIG. 7 shows to those of ordinary skill in the art, the selection and use of either Fakra-compliant connector 10, or the circuit board-mounted Fakra-compliant antenna 50, can be made at the time of assembly of the circuit board 70, the selection being a design choice.

Figure 8:
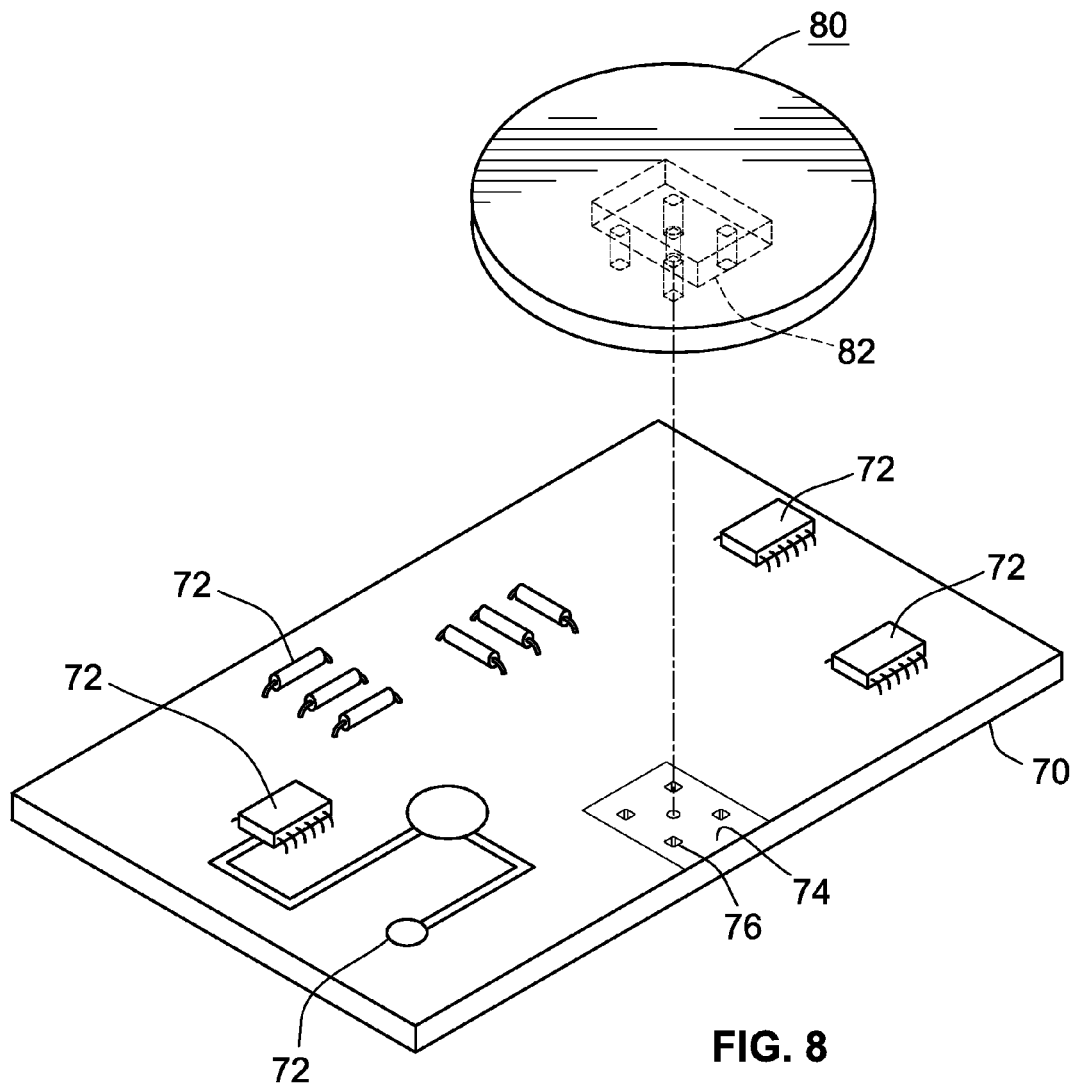
FIG. 8 shows an alternate embodiment of a Fakra-compliant antenna, mountable on a circuit board.
Figure 9:
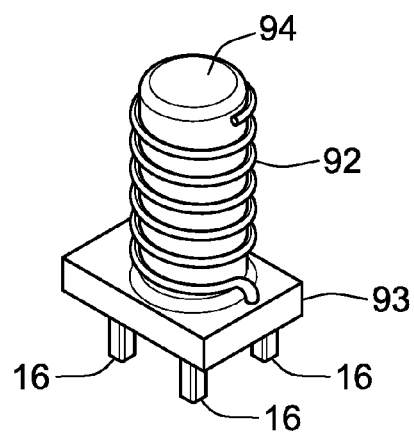
FIG. 9 shows another alternate embodiment of a Fakra-compliant antenna.

FIGS. 8 and 9 show two alternate embodiments of Fakra-compliant antennas. The antenna 80 depicted in FIG. 8 is also a circuit-board mountable Fakra-compliant antenna 80 and is shown used with the circuit board 70 shown in FIG. 7, and therefore with the same types of communications devices formed from the various electronic components 72 required by such devices, all of which are known to those of ordinary skill. The Fakra compliant antenna 80 shown in FIG. 8 has a foot print, i.e., the area it occupies, larger than the area or footprint of the Fakra ISO-compliant hole pattern 76. The Fakra-compliant antenna 80 also includes Fakra-compliant alignment pins 82 for aligning the antenna 80 with the Fakra ISO-compliant hole pattern 76 on circuit-board 70.

FIG. 9 shows another embodiment of a Fakra-compliant antenna 90 having a coil of wire 92 formed on a cylindrical but upright portion 94. As with the antennas depicted in FIGS. 4-8, the antenna 90 of FIG. 9 also has Fakra-compliant alignment pins 16 and a Fakra-compliant signal lead 18 on a circuit board mounting portion 93 that enable the antenna 90 to be mounted into a Fakra-compliant hole pattern on any circuit board. Unlike the embodiments shown in FIGS. 4-8, the Fakra-compliant antenna 90 shown in FIG. 9 fits entirely within the footprint of a Fakra-compliant mounting hole pattern.

Figure 10:
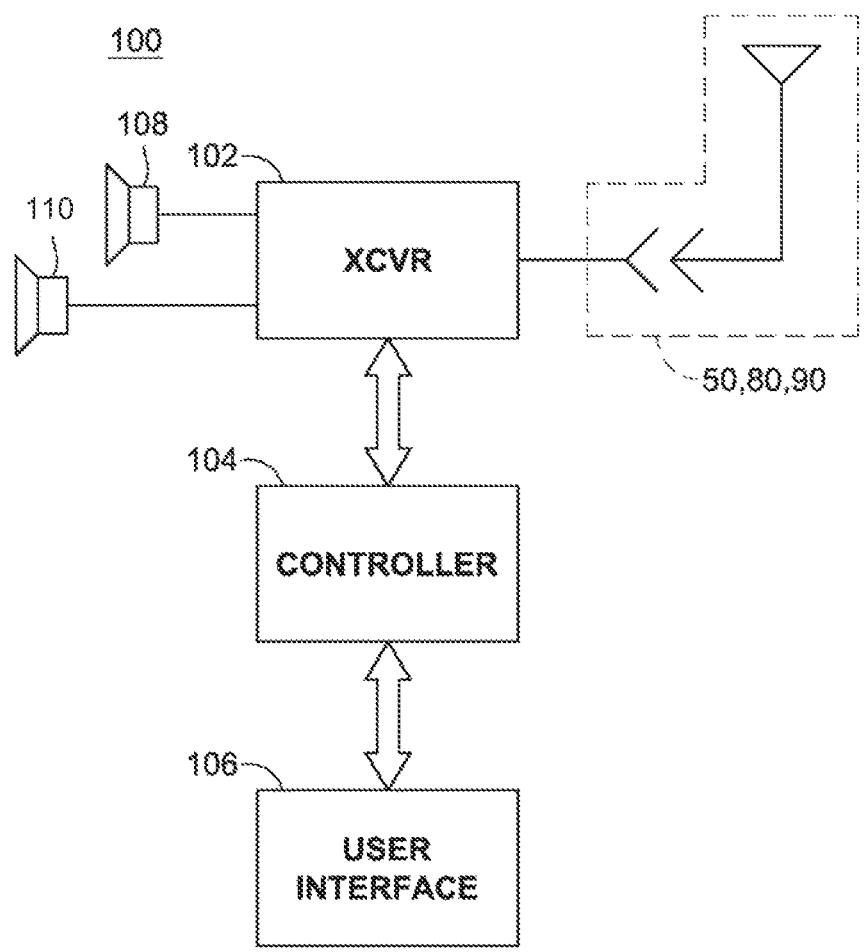
FIG. 10 is a block diagram of a wireless communications device using a Fakra-compliant antenna, such as those depicted in FIG. 4, 8 or 9.

Finally, and for the sake of completeness, FIG. 10 shows a schematic diagram of a communications device 100 comprised of radio transceiver 102, the functionally-necessary components of which are well-known to those of ordinary skill in the communications art. The transceiver 102 is operatively coupled to, and controlled by a controller 104, such as a microcontroller or microprocessor, which is itself coupled to a user interface 106, such as a keyboard and liquid crystal display device. A speaker 108 and microphone 110 coupled to the transceiver enable audio signals to be carried between the transceiver and a user of the device 100. In one embodiment, the communications device 100 is embodied as a cellular telephone. In another embodiment, the communications device 100 is either a Bluetooth transceiver, GPS receiver or a RF location device for tracking and/or locating stolen vehicles.

The components of the communications device 100 depicted in FIG. 10 are preferably mounted on one or more circuit boards. Everyone knows that such circuit boards are themselves mounted in an appropriate housing, not shown for purposes of clarity. Reference numeral 50 in FIG. 10 depicts any one of the Fakra-compliant antennae shown in Figs. FIG. 10 thus depicts a wireless communications device, such as a cell phone, GPS receiver or Bluetooth device, the operation of which is enabled through the use of either a circuit board-mounted Fakra antenna or an external antenna that is coupled to the device through a circuit board mounted Fakra connector, such as the connector 10 depicted in FIGS. 1-3.

It should be noted that the antennas depicted in FIGS. 4-9 are single band radio frequency transducers, by which is meant that the antennae are resonant in one band, such as the 800 Mhz. band commonly used by cellular telephones. Alternate embodiments of the antenna disclosed herein include multiband antennas which, resonate in multiple different bands that include, but which are not limited to, the 800, 900, 1200 and 1800 Mhz bands. Such antennae can be constructed from winding additional coils over those shown in the figures, or selectively choosing the electrical lengths of the coil 54 to have multiple resident frequencies at harmonic frequencies thereof.

The embodiments described above are for purposes of explanation and illustration. They should not be construed to be limiting the invention or as defining the invention. The invention is defined by the scope of the appurtenant claims.

What is claimed is:

1. An antenna comprising:
   a) a dielectric substrate comprising a circuit board mounting portion and a cylindrical portion extending from a first side of the circuit board mounting portion, a second side of the circuit board mounting portion having a plurality of pins extending from the second side of the circuit board mounting portion, the plurality of pins being configured to be mounted into a FAKRA ISO-compliant hole pattern in a circuit board, the second side of the circuit board mounting portion being configured to face the surface of a circuit board having a FAKRA ISO-compliant hole pattern; and
   b) a length of wire a first portion of which is wound around the dielectric substrate cylindrical portion to form a first coil, the length of wire having a second portion that extends from the first portion along the second side, the second portion having an end, configured to extend away from the second side and into a hole in a printed circuit board such that when the antenna is attached to a circuit board, the second portion of the length of wire will be located between the second side of the circuit board mounting portion and the circuit board.

2. The antenna of claim 1, wherein the circuit board mounting portion is substantially cube-shaped and wherein the cylindrical portion comprises a cylindrical surface devoid of projections from the cylindrical surface.

3. The antenna of claim 1, further comprising a second coil wound over the first coil.

4. The antenna of claim 3, wherein the first coil and the second coil are both configured to have multiple resonant frequencies.

5. The antenna of claim 1, wherein the cylindrical portion is at least partially covered with conductive material and wherein the wire has first and second opposing ends, the uncoated portion of the wire being located proximate to the first end, the second end of the wire being electrically connected to said conductive material coating the dielectric substrate cylindrical portion.

6. The antenna of claim 1, wherein the dielectric substrate cylindrical portion is at least partially covered with conductive material and wherein the wire has first and second opposing ends, the uncoated portion of the wire being located proximate to the first end, the second end of the wire electrically floating.

7. The antenna of claim 1, wherein the cylindrical portion is configured to be oriented upright and substantially orthogonal to the surface of a circuit board to which the antenna is to be attached.

8. The antenna of claim 7, wherein the circuit board mounting portion and the cylindrical portion are configured such that the circuit board mounting portion is between the cylindrical portion and the surface of a circuit board to which the antenna is to be attached.

9. A circuit board comprising:
 a) a plurality of electronic components mounted to said circuit board;
 b) a plurality of holes in the circuit board, the plurality of holes being arranged in a FAKRA ISO-compliant pattern; and
 c) an antenna attached to the circuit board using at least one of the plurality of FAKRA-ISO-compliant mounting holes, the antenna being coupled to at least one of the plurality of electronic components, the antenna comprising:
  i) a dielectric substrate comprising: a circuit board mounting portion comprised of six sides, a first side covering the plurality of FAKRA-ISO-compliant mounting holes and facing the circuit board, the substrate additionally comprising: a cylindrical portion extending outwardly from a second side of the circuit board mounting portion, both the circuit board mounting portion and the cylindrical portion being formed as a monolithic block of dielectric material, the first side of the circuit board mounting portion having at least one alignment pin that extends into a first hole of the FAKRA ISO-compliant hole pattern;
  ii) a radio frequency (RF) energy transducer comprising: a length of wire, a first portion of the length of wire being wound around the dielectric substrate cylindrical portion to form a first coil around the cylindrical portion, the length of wire having a second portion that extends from the first portion into a second hole of the FAKRA ISO-compliant hole pattern, the second portion of the length of wire being located between the first side of the dielectric substrate and the circuit board.

10. The circuit board of claim 9, wherein the plurality of electronic components include at least one of:
 a) global positioning system (GPS) receiver;
 b) a Bluetooth transceiver; and
 c) a cellular telephone;
 wherein at least one component is coupled to the antenna; and
 wherein the antenna is configured to transduce radio frequency energy for the at least one component.

11. The circuit board of claim 10, wherein the first and second sides of the circuit board mounting portion are substantially orthogonal to each other whereby the cylindrical portion is substantially parallel to the surface of the circuit board.

12. The circuit board of claim 10, further comprising: a second coil wrapped around the dielectric substrate cylindrical portion and wherein the first coil is coupled to a first component, the second coil is coupled to a second component, the first coil being configured to transduce radio frequency signals at a first wavelength for the first component, the second coil being configured to transduce radio frequency signals at a second wavelength for the second component.

* * * * *